(12) United States Patent
Kim et al.

(10) Patent No.: US 10,553,725 B2
(45) Date of Patent: Feb. 4, 2020

(54) VERTICAL STACK TRANSISTOR, A DISPLAY DEVICE INCLUDING THE VERTICAL STACK TRANSISTOR, AND A MANUFACTURING METHOD OF THE DISPLAY DEVICE

(71) Applicants: SAMSUNG DISPLAY CO., LTD., Yongin-si, Gyeonggi-Do (KR); CHUNG ANG University Industry Academic Cooperation Foundation, Seoul (KR)

(72) Inventors: Tae Young Kim, Yongin-si (KR); Jong Woo Park, Yongin-si (KR); Hyuck-In Kwon, Seoul (KR); Dae-Hwan Kim, Seoul (KR); Hee-Joong Kim, Seoul (KR); Sae-Young Hong, Seoul (KR)

(73) Assignees: Samsung Display Co., Ltd., Yongin-Si, Gyeonggi-Do (KR); Chung Ang University Industry Academic Cooperation Foundation, Seoul (KR)

(*) Notice: Subject to any disclaimer, the term of this patent is extended or adjusted under 35 U.S.C. 154(b) by 0 days.

(21) Appl. No.: 16/100,350

(22) Filed: Aug. 10, 2018

(65) Prior Publication Data
US 2019/0206967 A1 Jul. 4, 2019

(30) Foreign Application Priority Data

Jan. 4, 2018 (KR) .................. 10-2018-0001378

(51) Int. Cl.
| *H01L 29/786* | (2006.01) |
| *H01L 27/32* | (2006.01) |
| *H01L 27/088* | (2006.01) |
| *H01L 25/07* | (2006.01) |
| *G09G 3/3291* | (2016.01) |
| *G09G 3/3233* | (2016.01) |

(Continued)

(52) U.S. Cl.
CPC ..... *H01L 29/78642* (2013.01); *G09G 3/3233* (2013.01); *G09G 3/3266* (2013.01);
(Continued)

(58) Field of Classification Search
CPC .......... H01L 29/78642; H01L 29/7926; H01L 25/0657; H01L 25/074; H01L 25/117;
(Continued)

(56) References Cited

U.S. PATENT DOCUMENTS 7,476,893 B2 1/2009 Yang et al.
9,755,010 B2 9/2017 Rankov et al.
(Continued)

OTHER PUBLICATIONS

M. A. McCarthy et al., "High Current, Low Voltage Carbon Nanotube Enabled Vertical Organic Field Effect Transistors", Nano Lett. 2010, 10, pp. 3467-3472.

(Continued)

*Primary Examiner* — Scott B Geyer
(74) *Attorney, Agent, or Firm* — F. Chau & Associates, LLC

(57) ABSTRACT

A vertical stack transistor includes: a first transistor and a second transistor, located in a vertical direction, wherein the first transistor includes a first gate electrode, a first insulating layer, a first electrode, a first channel, and a second electrode, which are sequentially stacked in the vertical direction, and the second transistor includes a second gate electrode, a second insulating layer, a third electrode, a second channel, and a fourth electrode, which are sequentially stacked in the vertical direction, wherein the second gate electrode and the second electrode are the same electrode.

14 Claims, 10 Drawing Sheets

(51) Int. Cl.
  *H01L 29/423* (2006.01)
  *G09G 3/3266* (2016.01)
  *H01L 29/78* (2006.01)

(52) U.S. Cl.
  CPC ......... *G09G 3/3291* (2013.01); *H01L 25/074* (2013.01); *H01L 27/088* (2013.01); *H01L 27/3246* (2013.01); *H01L 27/3276* (2013.01); *H01L 29/4232* (2013.01); *G09G 2300/0819* (2013.01); *G09G 2310/08* (2013.01); *H01L 29/7827* (2013.01)

(58) Field of Classification Search
  CPC . H01L 25/167; H01L 27/3276; H01L 27/088; H01L 27/3246; H01L 29/4232; H01L 29/7827; G09G 3/3233; G09G 3/3266; G09G 3/3291; G09G 2300/0819; G09G 2310/08
  See application file for complete search history.

(56) References Cited

U.S. PATENT DOCUMENTS

| | | | | |
|---|---|---|---|---|
| 2013/0146931 A1* | 6/2013 | Liu | ..................... | H01L 27/0688 257/99 |
| 2017/0053975 A1* | 2/2017 | Cho | ................... | H01L 27/3265 |
| 2018/0122298 A1* | 5/2018 | Lee | ...................... | G09G 3/3233 |
| 2018/0122832 A1* | 5/2018 | Lee | ................... | G02F 1/133345 |
| 2018/0145185 A1* | 5/2018 | Kim | ................... | H01L 27/1225 |
| 2018/0204856 A1* | 7/2018 | Noh | .................. | H01L 29/41733 |

OTHER PUBLICATIONS

S. Lee et al., "Subthreshold Schottky-barrier thin-film transistors with ultralow power and high intrinsic gain", Science 2016, 354, pp. 302-304.

H. Yu et al., "Vertical Organic Field-Effect Transistors for Integrated Optoelectronic Applications", ACS Appl. Mater Interfaces. 2016, 8, pp. 10430-10435.

X. Xu et al., "Source-Gated Transistors for Power- and Area-Efficient AMOLED Pixel Circuits", J. Disp. Technol., 2014, 10, pp. 928-933.

L. Wang et al., "Tunneling contact IGZO TFTs with reduced saturation voltages", Appl. Phys. Lett., 2017, 110, pp. 152105-1-152105-4.

S. Kim et al., "Large-Area Schottky Barrier Transistors Based on Vertically Stacked Graphene-Metal oxide Heterostructures", Adv. Funct. Mater., 2017, 1700651 (8 pages).

J. Heo et al., "Graphene and Thin-Film Semiconductor Heterojunction Transistors Integrated on Wafer Scale for Low-Power Electronics", Nano Lett. 2013, 13, pp. 5967-5971.

* cited by examiner

VERTICAL STACK TRANSISTOR, A DISPLAY DEVICE INCLUDING THE VERTICAL STACK TRANSISTOR, AND A MANUFACTURING METHOD OF THE DISPLAY DEVICE

CROSS-REFERENCE TO RELATED APPLICATION

The present application claims priority under 35 U.S.C. § 119(a) to Korean patent application 10-2018-0001378 filed on Jan. 4, 2018 in the Korean Intellectual Property Office, the disclosure of which is incorporated by reference herein in its entirety.

1. TECHNICAL FIELD

An exemplary embodiment of the present inventive concept relates to a vertical stack structure, a display device including the vertical stack structure, and a manufacturing method of the display device.

2. DISCUSSION OF RELATED ART

As information technologies develop, the display medium between a user and information becomes increasingly relevant to the user's experience. Accordingly, display devices such as a liquid crystal display device, an organic light emitting display device, and a plasma display panel are increasingly being used.

Of these display devices, the organic light emitting display device displays images using an organic light emitting diode that generates light by the recombination of electrons and holes. The organic light emitting display device has a high response speed and is driven with low power consumption.

To accommodate high-resolution panels, each pixel of the organic light emitting display device is provided with more transistors, and thus, the aperture ratio of each pixel is decreased.

If, however, the aperture ratio of each pixel is decreased, the lifespan of the organic light emitting diode is decreased.

SUMMARY

According to an exemplary embodiment of the present inventive concept, there is provided a vertical stack transistor including: a first transistor and a second transistor, located in a vertical direction, wherein the first transistor includes a first gate electrode, a first insulating layer, a first electrode, a first channel, and a second electrode, which are sequentially stacked in the vertical direction, and the second transistor includes a second gate electrode, a second insulating layer, a third electrode, a second channel, and a fourth electrode, which are sequentially stacked in the vertical direction, wherein the second gate electrode and the second electrode are the same electrode.

According to an exemplary embodiment of the present inventive concept, there is provided a display device including: a first transistor having a first gate electrode connected to a scan line and a first electrode connected to a data line; an organic light emitting diode; a second transistor having a second gate electrode connected to a second electrode of the first transistor, the second transistor connecting the organic light emitting diode and a power line; and a storage capacitor connecting the second gate electrode and the power line, wherein the first transistor includes the first gate electrode, a first insulating layer, the first electrode, a first channel, and the second electrode, which are sequentially stacked in a vertical direction, and the second transistor includes the second gate electrode, a second insulating layer, a third electrode, a second channel, and a fourth electrode, which are sequentially stacked in the vertical direction, wherein the second gate electrode and the second electrode are the same electrode.

The third electrode may be connected to the power line, and the fourth electrode may be connected to an anode of the organic light emitting diode.

The second gate electrode and the third electrode may be electrodes of the storage capacitor.

The data line may have a two layer structure, wherein a first layer of the data line has the same material as the first electrode and a second layer of the data line has the same material as the second gate electrode.

The power line may have a two layer structure, wherein a first layer of the power line has the same material as the third electrode and a second layer of the power line has the same material as the fourth electrode.

The second insulating layer may be located between the data line and the power line.

The scan line may include the same material as the first gate electrode.

The first insulating layer may be located between the data line and the scan line.

According to an exemplary embodiment of the present inventive concept, there is provided a method of manufacturing a display device, the method including: forming a first gate electrode and a scan line; forming a first insulating layer that covers the first gate electrode and the scan line; forming a first portion of a data line and a first electrode on the first insulating layer; and forming a first channel on the first electrode.

The method may further include simultaneously forming a second electrode and a second gate electrode on the first channel.

A second portion of the data line may be formed in the forming of the second electrode and the second gate electrode.

The method may further include: covering the data line and the second electrode with a second insulating layer; and forming a first portion of a power line and a third electrode on the second insulating layer, wherein at least a portion of the third electrode overlaps with the second electrode.

The method may further include forming a second channel on the third electrode, wherein at least a portion of the second channel overlaps with the second electrode.

The method may further include forming a fourth electrode on the second channel.

A second portion of the power line may be formed in the forming of the fourth electrode.

The method may further include: forming a protective layer including an opening through which the fourth electrode is exposed; forming an anode on a portion of the protective layer and the fourth electrode; forming a pixel defining layer including an opening through which a portion of the anode is exposed; forming an emitting layer on a portion of the pixel defining layer and the exposed anode; and forming a cathode on the emitting layer and the pixel defining layer.

According to an exemplary embodiment of the present inventive concept, there is provided a display device including: a compensation transistor including a first gate electrode, a first insulating layer, a first electrode, a first channel, and a second electrode, which are sequentially stacked in a vertical direction; a driving transistor including a second gate electrode, a second insulating layer, a third electrode, a second channel, and a fourth electrode, which are sequentially stacked in the vertical direction; and a switching transistor having a first electrode connected to a data line, a second electrode connected to the fourth electrode of the driving transistor, and a gate electrode connected to a scan line, wherein the first electrode of the compensation transistor is connected to the fourth electrode of the driving transistor, and the second electrode of the compensation transistor and the second gate electrode are the same electrode.

The first gate electrode of the compensation transistor may be connected to the scan line.

The display device may further include: a storage capacitor connecting a power line and the second gate electrode of the driving transistor; a first emission control transistor connecting the power line and the third electrode of the driving transistor; a second emission control transistor connecting the fourth electrode of the driving transistor and an anode of an organic light emitting diode; a first initialization transistor connecting the second gate electrode of the driving transistor and an initialization power line; and a second initialization transistor connecting the anode of the organic light emitting diode and the initialization power line.

The first electrode of the compensation transistor may be a source electrode and the second electrode of the compensation transistor may be a drain electrode.

The third electrode of the driving transistor may be a source electrode and the fourth electrode of the driving transistor may be a drain electrode.

BRIEF DESCRIPTION OF THE DRAWINGS

The above and other features of the present inventive concept will become more apparent by describing in detail exemplary embodiments thereof with reference to the accompanying drawings.

DETAILED DESCRIPTION OF THE EMBODIMENTS

Figure 1:
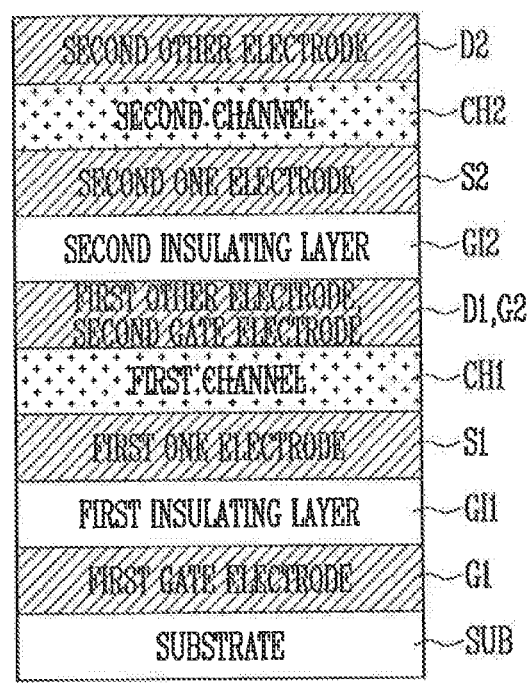
FIG. 1 is a view illustrating a vertical stack transistor according to an exemplary embodiment of the present inventive concept.

The present inventive concept will now be described more fully with reference to the accompanying drawings, in which exemplary embodiments of the inventive concept are shown.

In the drawings, like reference numerals may refer to like elements.

In addition, the size and thickness of each element illustrated in the drawings are shown for better understanding and ease of description. Accordingly, the present inventive concept is not limited thereto.

FIG. 1 is a view illustrating a vertical stack transistor 2TR according to an exemplary embodiment of the present inventive concept.

Referring to FIG. 1, the vertical stack transistor 2TR according to the present exemplary embodiment includes a first transistor and a second transistor located in a vertical direction. The vertical direction may be a direction substantially perpendicular to a horizontal direction, for example.

The first transistor includes a first gate electrode G1, a first insulating layer GI1, a first one electrode S1, a first channel CH1, and a first other electrode D1, which are sequentially stacked in the vertical direction.

The second transistor includes a second gate electrode G2, a second insulating layer GI2, a second one electrode S2, a second channel CH2, and a second other electrode D2, which are sequentially stacked in the vertical direction. For example, the components of the first transistor and the second transistor are sequentially stacked on a surface of a substrate SUB.

Each of the first transistor and the second transistor may be a Schottky barrier transistor having a vertical channel structure. The Schottky barrier transistor is smaller than most field effect transistors and has an output impedance larger than most field effect transistors. Hence, the Schottky barrier transistor has excellent saturation characteristics of its output curve, and thus, can be used to increase the area of pixels and reduce power consumption when used as a driving transistor of an organic light emitting display device.

In the vertical stack transistor 2TR according to the present embodiment, the size of an energy barrier between a source electrode and a channel is changed by a voltage applied to a gate electrode. Therefore, a current injected into the channel from the source electrode can be changed. In the present embodiment, the source electrode may be the first one electrode S1 of the first transistor and the second one electrode S2 of the second transistor.

In the present embodiment, the second gate electrode G2 and the first other electrode D1 are the same electrode. For example, the same electrode is an electrode electrically connected to the same node, and also an electrode that simultaneously serves as both the second gate electrode G2 and the first other electrode D1. In other words, the first transistor and the second transistor share the second gate electrode G2 and the first other electrode D1. In this case, one electrode layer can be saved, since only one electrode layer is required for the single electrode.

The present embodiment may be applied to a circuit in which the first other electrode D1 of the first transistor is connected to the second gate electrode G2 of the second transistor. For example, the present embodiment may be applied to first transistors T1, T3' and second transistors T2, T2' of FIGS. 3 and 16, which will be described later.

In the first transistor, as the first channel CH1 is conducted based on a voltage applied to the first gate electrode G1, a current flows between the first one electrode S1 and the first other electrode D1. In the second transistor, as the second channel CH2 is conducted based on a voltage applied to the second gate electrode G2 through the first other electrode D1, a current flows between the second one electrode S2 and the second other electrode D2. The current between the second one electrode S2 and the second other electrode D2 may flow along with the current between the first one electrode S1 and the first other electrode D1.

The first channel CH1 and the second channel CH2 may be formed as semiconductor selected according to product design. For example, each of the first and second channels CH1 and Ch2 may be an oxide semiconductor, an organic semiconductor, an amorphous silicon, a poly-silicon, etc. For example, the oxide semiconductor may be formed of zinc oxide (ZnO), or be formed of InZnO (IZO), InGaZnO (IGZO), HfInZnO (HIZO), etc., in which zinc oxide (ZnO) is doped with indium (in), gallium (Ga), hafnium (Hf), stannum (Sn), etc.

Figure 2:
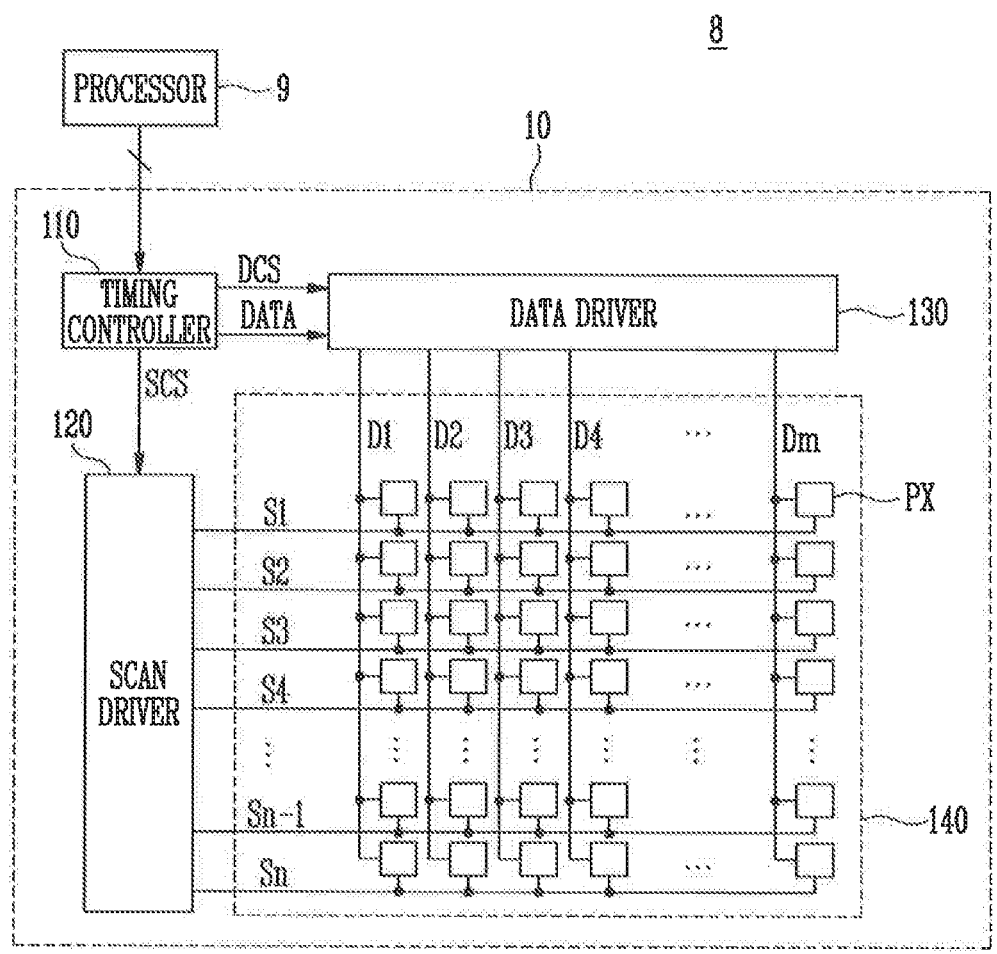
FIG. 2 is a view illustrating a display device according to an exemplary embodiment of the present inventive concept.

FIG. 2 is a view illustrating a display device 8 according to an exemplary embodiment of the present inventive concept.

Referring to FIG. 2, the display device 8 according to the present embodiment includes a processor 9 and a display panel 10.

The processor 9 may be a general-purpose processing device. For example, the processor 9 may be an application processor (AP) of a mobile phone or a processing device of another display device.

The processor 9 may transmit signals used for image display to the display panel 10. In FIG. 2, it is illustrated that the signals used for image display are transmitted from the processor 9 to a timing controller 110. However, the signals used for image display may be transmitted to an integrated circuit (IC) in which the timing controller 110 and a data driver 130 are integrated. Additionally, the signals used for image display may be transmitted to the data driver 130. For example, the signals used for image display may include a data enable signal, a vertical synchronization signal, a horizontal synchronization signal, and an image signal.

The display panel 10 may include the timing controller 110, a scan driver 120, the data driver 130, and a pixel unit 140. The display panel 10 displays an image through the pixel unit 140, using an image signal and an image control signal, which are provided from the processor 9.

The timing controller 110 transmits, to the data driver 130, an image signal DATA corrected to be suitable for specifications of the data driver 130, using a data enable signal, a vertical synchronization signal, a horizontal synchronization signal, a first image signal, a second image signal, and a third image signal. In addition, the timing controller 110 transmits control signals DCS (e.g., a data control signal) and SCS (e.g., a scan control signal) to the data driver 130 and the scan driver 120, respectively.

The data driver 130 supplies a data voltage to the pixel unit 140. For example, the data driver 130 may apply a plurality of data voltages generated based on the data control signal DCS and the corrected image signal DATA to a plurality of data lines D1, D2, D3, D4, . . . , and Dm.

The scan driver 120 supplies a scan signal to the pixel unit 140. For example, the scan driver 120 may supply a plurality of scan signals to a plurality of scan lines S1, S2, S3, S4, . . . , Sn−1, and Sn in response to the scan control signal SCS. For example, the scan driver 120 may sequentially supply the plurality of scan signals to the plurality of scan lines S1, S2, S3, S4, . . . , Sn−1, and Sn.

The pixel unit 140 includes a plurality of pixels PX. Each of the plurality of pixels PX may emit light with a gray scale corresponding to a data voltage. Each of the plurality of pixels PX may be coupled to a corresponding data line among the data lines D1, D2, D3, D4, . . . , and Dm and a corresponding scan line among the scan lines S1, S2, S3, S4, . . . , Sn−1, and Sn. Additionally, each of the plurality of pixels PX may be supplied with a data voltage and a scan signal through its corresponding data line among the data lines D1, D2, D3, D4, . . . , and Dm and its corresponding scan line among the scan lines S1, S2, S3, S4, . . . , Sn−1, and Sn. When the display device 8 is an organic light emitting display device, each pixel PX may include an organic light emitting diode. When the display device 8 is a liquid crystal display device, each pixel PX may include a liquid crystal layer.

Figure 3:
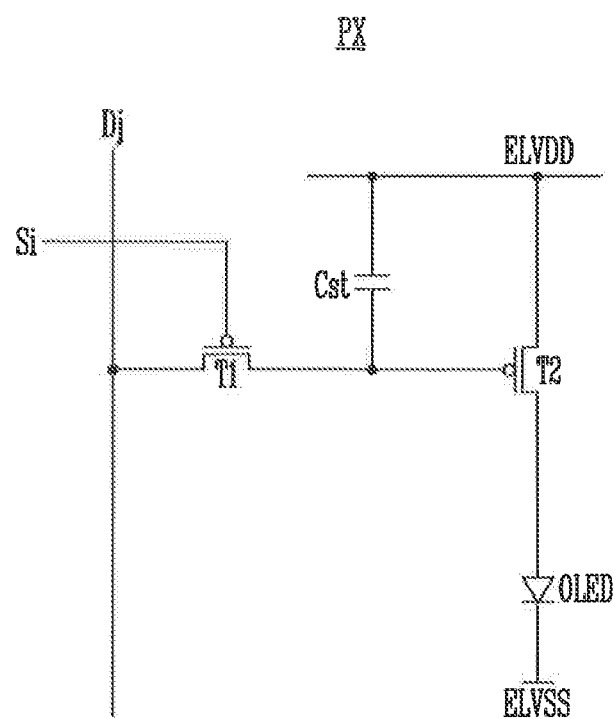
FIG. 3 is a view illustrating a pixel according to an exemplary embodiment of the present inventive concept.

FIG. 3 is a view illustrating a pixel according to an exemplary embodiment of the present inventive concept.

Referring to FIG. 3, the pixel PX according to the present embodiment may include a plurality of transistors T1 and T2 (e.g., a first transistor T1 and a second transistor T2), a storage capacitor Cst, and an organic light emitting diode OLED.

In the present embodiment, the plurality of transistors T1 and T2 may constitute the vertical stack transistor of FIG. 1. Hereinafter, reference numerals may correspond to those described with reference to FIG. 1.

In the present embodiment, it is illustrated that each of the transistors T1 and T2 is a P-type transistor. However, each of the transistors T1 and T2 may be an N-type transistor. Furthermore, a subsidiary transistor or another element may be added to the pixel circuit of FIG. 3. In addition, the pixel circuit of FIG. 3 may be reconfigured, e.g., the organic light emitting diode OLED may be located between the second transistor T2 and a power line ELVDD.

The first one electrode S1 of the first transistor T1 may be connected to a data line Dj, the first gate electrode G1 of the first transistor T1 may be connected to a scan line S1, and the first other electrode D1 of the first transistor T1 may be connected to the second gate electrode G2 of the second transistor T2.

The second one electrode S2 of the second transistor T2 may be connected to the power line ELVDD, the second other electrode D2 of the second transistor T2 may be connected to an anode of the organic light emitting diode OLED, and the second gate electrode G2 of the second transistor T2 may be connected to the first other electrode D1 of the first transistor T1.

The storage capacitor Cst may connect the second gate electrode G2 of the second transistor T2 and the power line ELVDD. The storage capacitor Cst may also connect the first other electrode D1 of the first transistor T1 and the power line ELVDD.

The anode of the organic light emitting diode OLED may be connected to the second other electrode D2 of the second transistor T2, and a cathode of the organic light emitting diode OLED may be connected to a power line ELVSS.

A voltage applied to the power line ELVDD may be larger than that applied to the other power line ELVSS.

Hereinafter, a driving method of the pixel PX of FIG. 3 will be described.

If a scan signal is supplied to the scan line Si on a corresponding pixel row, the first gate electrode G1 of the first transistor T1 is applied with a voltage having a turn-on level. Thus, the first transistor T1 is conducted to electrically connect the data line Dj and the second gate electrode G2 of the second transistor T2. At this time, the difference between a data voltage applied to the data line Dj and a voltage applied to the power line ELVDD is held in the storage capacitor Cst. The second transistor T2 controls an amount of driving current flowing from the power line ELVDD to the power line ELVSS according to the potential difference held in the storage capacitor Cst. The organic light emitting diode OLED emits light with a target luminance according to the amount of driving current controlled by the second transistor T2.

FIGS. 4 to 15 are views illustrating a manufacturing method of the pixel according to an exemplary embodiment of the present inventive concept.

Figure 4:
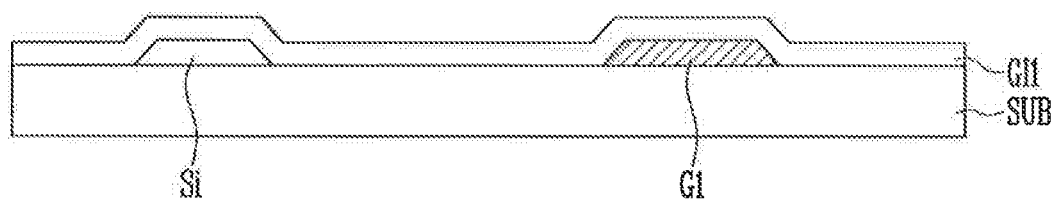
FIGS. 4, 5, 6, 7, 8, 9, 10, 11, 12, 13, 14 and 15 are views illustrating a manufacturing method of a pixel according to an exemplary embodiment of the present inventive concept.

Referring to FIG. 4, a substrate SUB made of an insulating material such as glass or plastic is prepared.

A first gate electrode G1 and a scan line Si are formed by forming a conductive layer on the substrate SUB and etching the conductive layer.

The conductive layer may be formed by thinly depositing a transparent conductive material such as indium tin oxide (ITO) or indium zinc oxide (IZO), or a metal such as tungsten (W), titanium (Ti), molybdenum (Mo), silver (Ag), tantalum (Ta), aluminum (Al), copper (Cu), gold (Au), or niobium (Nb), or any alloy thereof.

The first gate electrode G1 and the scan line Si may be simultaneously formed in the same layer to be connected to each other. Therefore, a bridge structure or the like through a contact hole is not required to connect the first gate electrode G1 and the scan line Si to each other. In an exemplary embodiment of the inventive concept, a buffer layer may be formed of a silicon oxide layer or a silicon nitride layer on the substrate SUB before the first gate electrode G1 and the scan line Si are formed.

Next, a first insulating layer GI1 covering the first gate electrode G1 and the scan line Si is formed. The first insulating layer GI1 may be made of an inorganic material. However, in an alternative embodiment, the first insulating layer GI1 may be made of an organic material.

Figure 5:
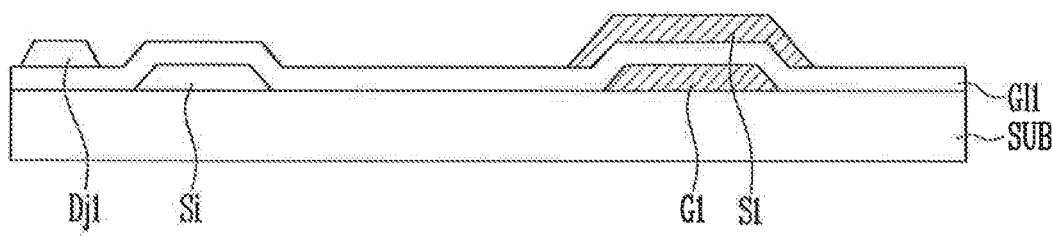

Referring to FIG. 5, the first one electrode S1 and one portion Dj1 of a data line Dj are formed by forming a conductive layer on the first insulating layer GI1 and etching the conductive layer. The first one electrode S1 and the data line Dj may be simultaneously formed in the same layer to be connected to each other. Therefore, a bridge structure or the like through a contact hole is not required to connect the first one electrode S1 and the data line Dj to each other. The first one electrode S1 may be a source electrode.

Figure 6:
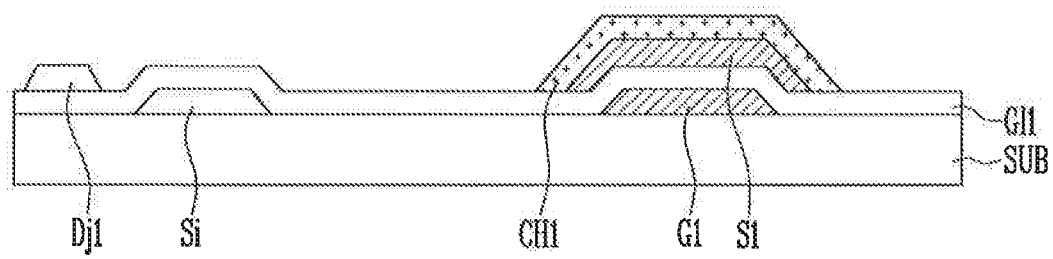

Next, referring to FIG. 6, a first channel CH1 is formed on the first one electrode S1. In the process of forming the first channel CH1, a part of the first channel CH1 may be stacked on the one portion Dj1 of the data line Dj. However, the part of the first channel CH1 may be removed by using a halftone mask or an etchant having an etching rate different from that of the first channel CH1.

Figure 7:
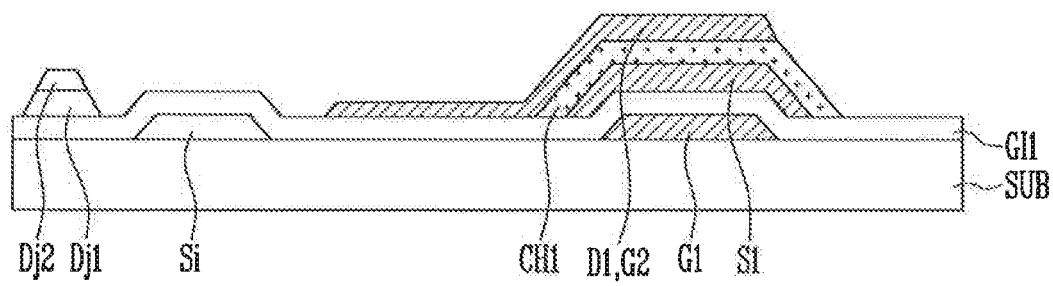

Next, referring to FIG. 7, by forming a conductive layer and etching the conductive layer, a first other electrode D1 and a second gate electrode G2 are simultaneously formed on the first channel CH. Additionally, another portion Dj2 of the data line Dj may be formed. At this time, unlike the first one electrode S1, the first other electrode D1 is not connected to the other portion Dj2 of the data line Dj (see FIG. 3). Therefore, the data line Dj may have a structure of two stacked layers in which one layer uses the same material Dj1 as the first one electrode S1 and the other layer Dj2 uses the same material as the second gate electrode G2. The first other electrode D1 may be a drain electrode.

The second gate electrode G2 may extend to constitute one electrode of a storage capacitor Cst.

Figure 8:
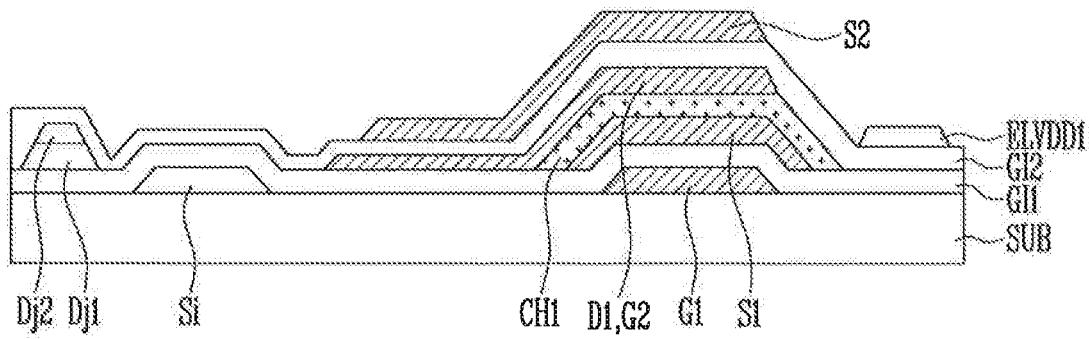

Next, referring to FIG. 8, the data line Dj1 and DJ2 and the first other electrode D1 are covered with a second insulating layer GI2. The second insulating layer GI2 may be made of an inorganic material. However, in an alternative embodiment, the second insulating layer GI2 may be made of an organic material.

In addition, by forming a conductive layer and etching the conductive layer, the second one electrode S2 and one portion ELVDD1 of a power line ELVDD are formed on the second insulating layer GI2 such that at least a portion of the second one electrode S2 overlaps with the first other electrode D1. The second one electrode S2 may be a source electrode. The second one electrode S2 and the one portion ELVDD1 of the power line ELVDD may be simultaneously formed in the same layer to be connected to each other. Therefore, a bridge structure or the like through a contact hole is not required to connect the second one electrode S2 and the one portion ELVDD1 of the power line ELVDD to each other.

In addition, the second one electrode S2 extends in correspondence with the second gate electrode G2. Therefore, the second one electrode S2 and the second gate electrode G2 can constitute electrodes of the storage capacitor Cst, respectively. Accordingly, a separate electrode layer for forming the storage capacitor Cst is not required.

Figure 9:
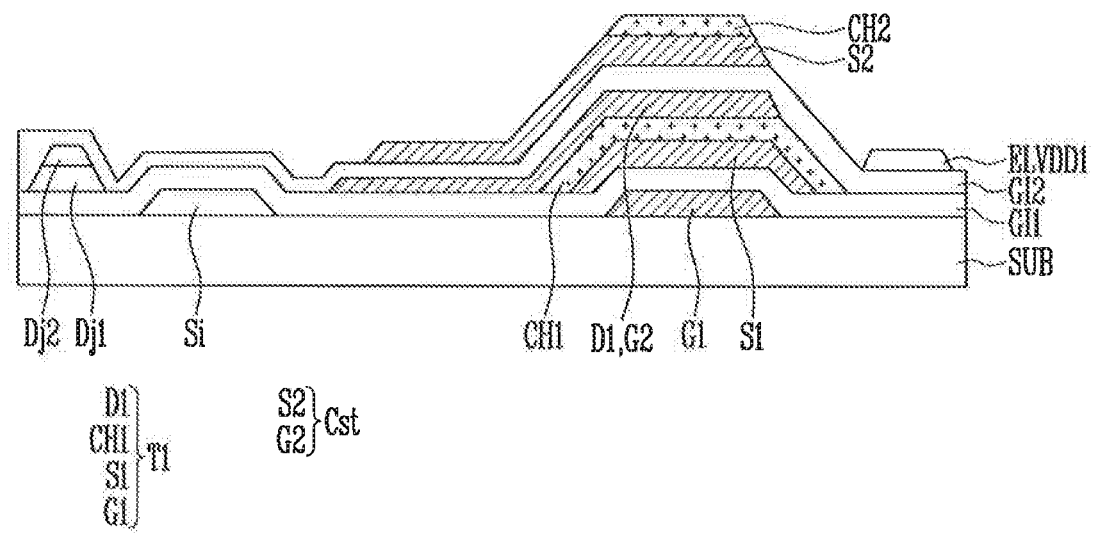

Next, referring to FIG. 9, a second channel CH2 is formed on the second one electrode S2 such that at least a portion of the second channel CH2 overlaps with the first other electrode D1.

In the process of forming the second channel CH2, a part of the second channel CH2 may be stacked on the one portion ELVDD1 of the power line ELVDD. However, the part of the second channel CH2 may be removed using a halftone mask or an etchant having an etching rate different from that of the second channel CH2.

Figure 10:
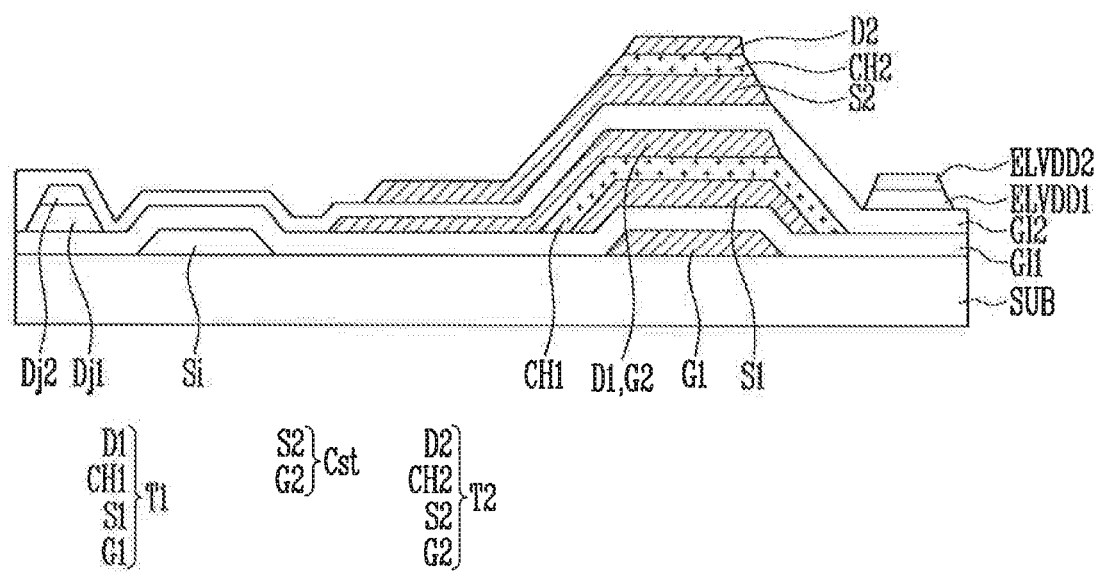

Next, referring to FIG. 10, by forming a conductive layer and etching the conductive layer, a second other electrode D2 is formed on the second channel CH2, and another portion ELVDD2 of the power line ELVDD is formed. The second other electrode D2 may be a drain electrode. Here, unlike the one portion ELVDD1 of the power line ELVDD, the other portion ELVDD2 of the power line ELVDD is not connected to the second other electrode D2 (see FIG. 3). Therefore, the power line ELVDD may have a structure of two stacked layers, one layer ELVDD1 using the same material as the second one electrode S2 and the other layer ELVDD2 using the same material as the second other electrode D2.

Using the processes up to FIG. 10, the vertical stack transistor 2TR including the first transistor T1 and the second transistor T2 can be formed and consequently applied to the pixel PX by efficiently using each electrode layer.

Figure 11:
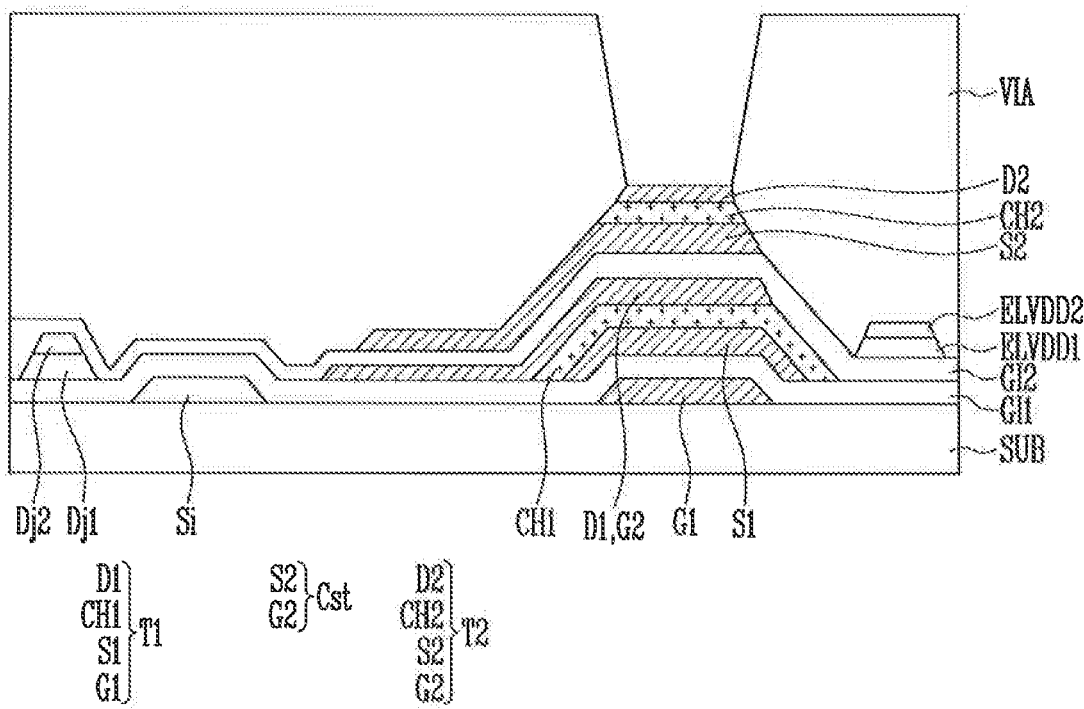

A process of connecting an organic light emitting diode OLED to the vertical stack transistor 2TR is illustrated in the following drawings starting from FIG. 11. First, there is formed a protective layer VIA including an opening through which the second other electrode D2 is exposed. The protective layer VIA may be made of an organic material such as acryl or polyimide. However, in an alternative embodiment, the protective layer VIA may be made of an inorganic material.

Figure 12:
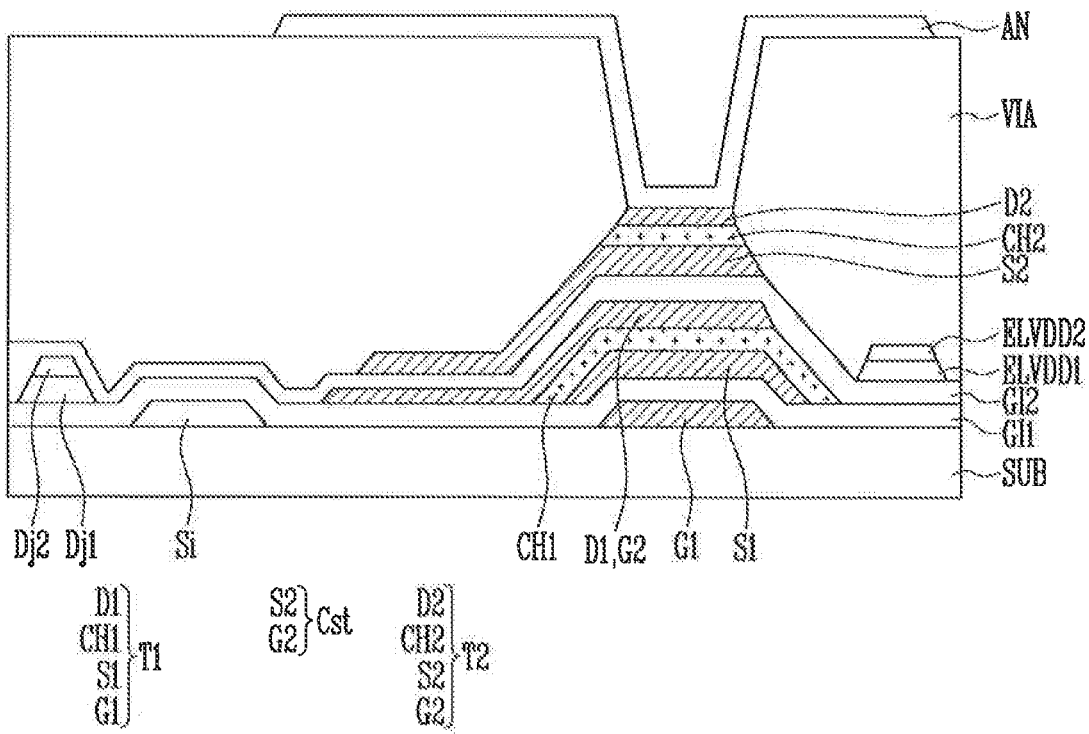
Figure 13:
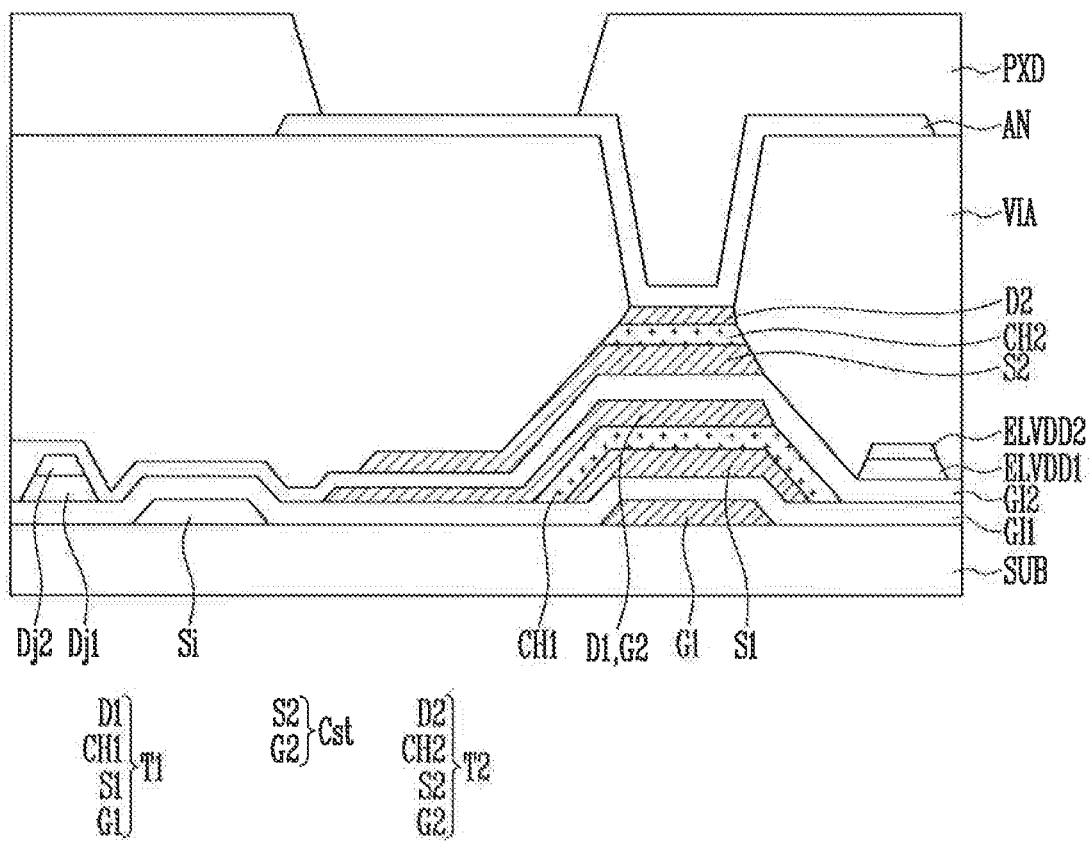

Referring to FIG. 12, an anode AN of the organic light emitting diode OLED is formed on a portion of the protective layer VIA and the second other electrode D2. Referring to FIG. 13, there is formed a pixel defining layer PXD including an opening through which a portion of the anode AN is exposed.

Figure 14:
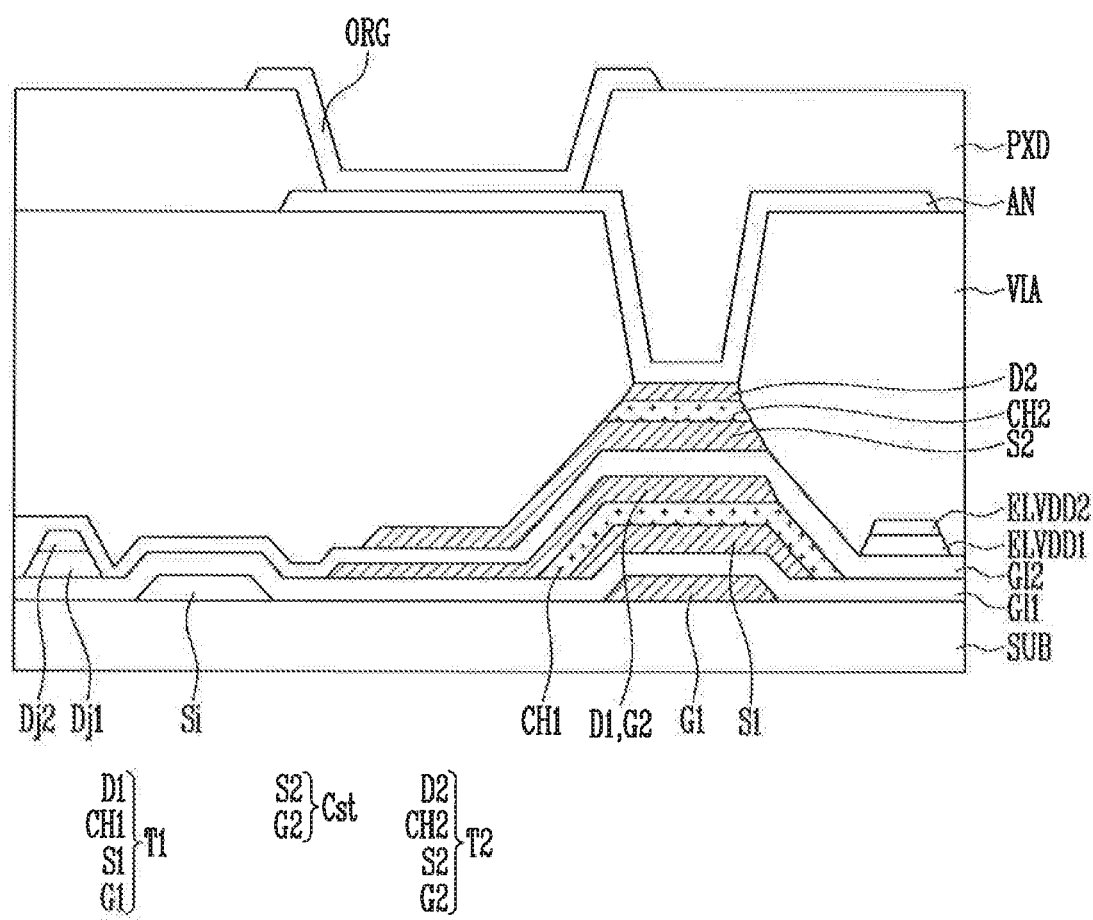
Figure 15:
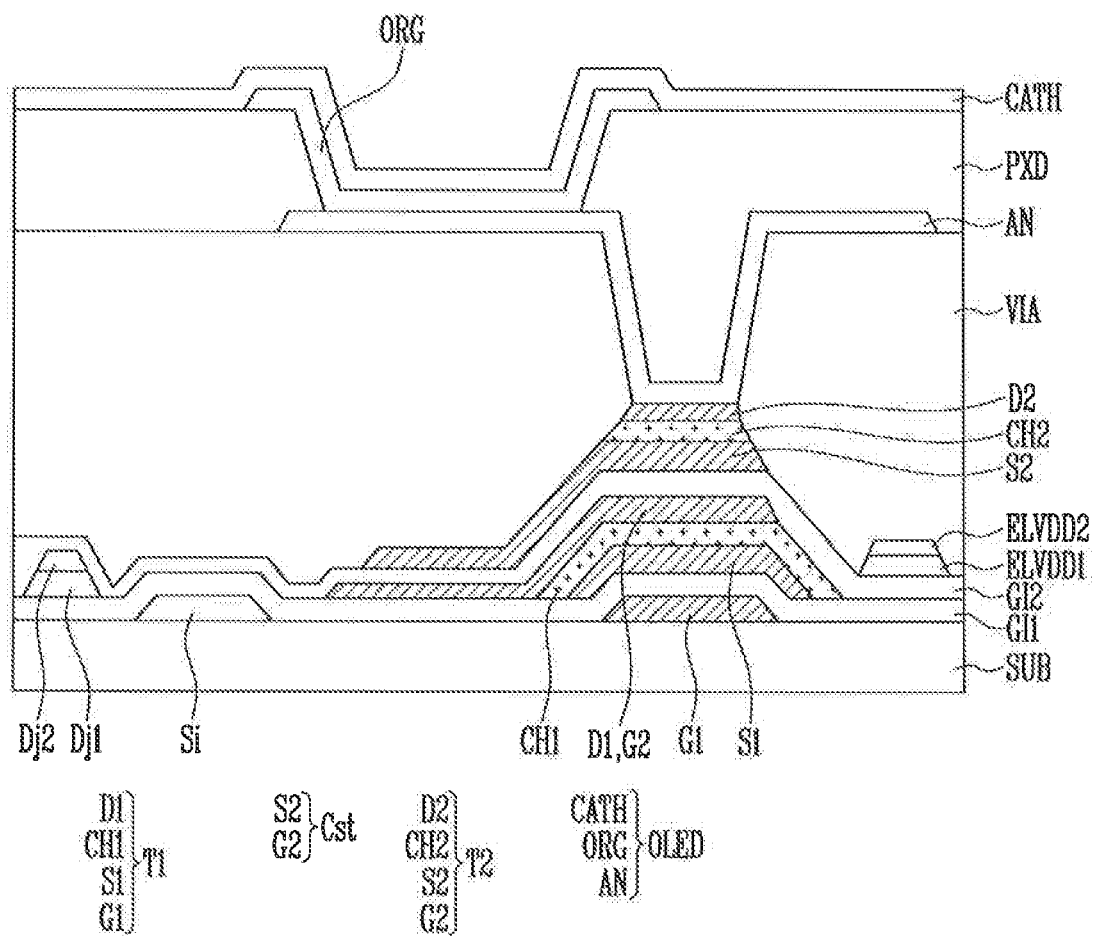

Next, referring to FIG. 14, an emitting layer ORG is formed on a portion of the pixel defining layer PXD and the exposed anode AN. Referring to FIG. 15, a cathode CATH is formed on the emitting layer ORG and the pixel defining layer PXD. Accordingly, the organic light emitting diode OLED is formed on the vertical stack transistor 2TR in this embodiment.

Figure 16:
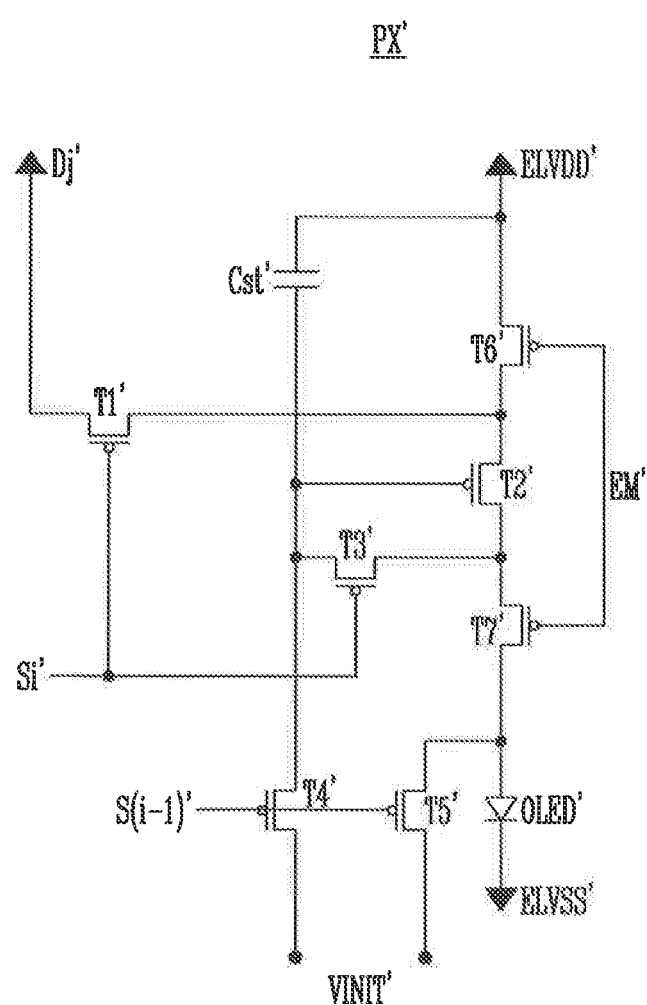
FIG. 16 is a view illustrating a pixel according to an alternative embodiment of the present inventive concept.

FIG. 16 is a view illustrating a pixel PX' according to an alternative embodiment of the present inventive concept.

Referring to FIG. 16, the pixel PX' according to the present embodiment includes a plurality of transistors T1', T2', T3', T4', T5', T6', and T7', a storage capacitor Cst', and an organic light emitting diode OLED'.

When the vertical stack transistor 2TR is applied to the pixel PX' of FIG. 16, the first transistor may be the transistor T3' and the second transistor may be the transistor T2'.

Hereinafter, a structure of the pixel PX' of FIG. 16 will be described.

A first electrode of the transistor T1' is connected to a data line Dj; a second electrode of the transistor T1' is connected to a first electrode of the transistor T2; and a gate electrode of the transistor T1' is connected to a scan line Si'. The transistor T1' may be a switching transistor.

The first electrode of the transistor T2' is connected to a second electrode of the transistor T6', a second electrode of the transistor T2' is connected to a first electrode of the transistor T7; and a gate electrode of the transistor T2' is connected to a first electrode of the storage capacitor Cst'.

The transistor T3' connects the gate electrode and the second electrode of the transistor T2, and a gate electrode of the transistor T3' is connected to the scan line Si'. The transistor T3' may be a compensation transistor.

A first electrode of the transistor T4' is connected to the gate electrode of the transistor T2, a second electrode of the transistor T4' is connected to an initialization power line VINT'. A gate electrode of the transistor T4' is connected to a previous scan line S(i−1)'. The gate electrode of the transistor T4' may be connected to another scan line or a dedicated initialization control line. The transistor T4' may be a first initialization transistor.

A first electrode of the transistor T5' is connected to an anode of the organic light emitting diode OLED, a second electrode of the transistor T5' is connected to the initialization power line VINT', and a gate electrode of the transistor T5' is connected to the previous scan line S(i−1). The second electrode of the transistor T5' may be connected to another initialization power line having a voltage value different from that of the initialization power line VINT'. The gate electrode of the transistor T5' may be connected to another scan line (e.g., the scan line Si') or a dedicated initialization control line. The transistor T5' may be a second initialization transistor.

A first electrode of the transistor T6' is connected to a power line ELVDD', the second electrode of the transistor T6' is connected to the first electrode of the transistor T2, and a gate electrode of the transistor T6' is connected to an emission control line EM'. The transistor T6' may be a first emission control transistor.

The first electrode of the transistor T7' is connected to the second electrode of the transistor T2, a second electrode of the transistor T7' is connected to the anode of the organic light emitting diode OLED, and a gate electrode of the transistor T7' is connected to the emission control line EM. The transistor T7' may be a second emission control transistor.

The storage capacitor Cst' connects the gate electrode of the transistor T2' and the power line ELVDD'. The power line ELVDD' is connected to a second electrode of the storage capacitor Cst'.

The anode of the organic light emitting diode OLED' Is connected to the second electrode of the transistor T7', and a cathode of the organic light emitting diode OLED' is connected to a power line ELVSS'. The organic light emitting diode OLED' to be located on a driving current path between the power line ELVDD' and the power line ELVSS' according to products to which the organic light emitting diode OLED' is applied.

In the display device and the manufacturing method thereof according to the present inventive concept, the aperture ratio of each pixel can be increased using the vertical stack transistor.

While the present inventive concept has been particularly shown and described with reference to exemplary embodiments thereof, it will be understood by those of ordinary skill in the art that various changes in form and details may be made thereto without departing from the spirit and scope of the present inventive concept as set forth in the following claims.

What is claimed is:

1. A vertical stack transistor, comprising:
    a first transistor and a second transistor, located in a vertical direction,
    wherein the first transistor includes a first gate electrode, a first insulating layer, a first electrode, a first channel, and a second electrode, which are sequentially stacked in the vertical direction, and
    the second transistor includes a second gate electrode, a second insulating layer, a third electrode, a second channel, and a fourth electrode, which are sequentially stacked in the vertical direction,
    wherein the second gate electrode and the second electrode are the same electrode.

2. A display device, comprising:
    a first transistor having a first gate electrode connected to a scan line and a first electrode connected to a data line;
    an organic light emitting diode;
    a second transistor having a second gate electrode connected to a second electrode of the first transistor, the second transistor connecting the organic light emitting diode and a power line; and
    a storage capacitor connecting the second gate electrode and the power line,
    wherein the first transistor includes the first gate electrode, a first insulating layer, the first electrode, a first channel, and the second electrode, which are sequentially stacked in a vertical direction, and
    the second transistor includes the second gate electrode, a second insulating layer, a third electrode, a second channel, and a fourth electrode, which are sequentially stacked in the vertical direction,
    wherein the second gate electrode and the second electrode are the same electrode.

3. The display device of claim 2, wherein the third electrode is connected to the power line, and
    the fourth electrode is connected to an anode of the organic light emitting diode.

4. The display device of claim 3, wherein the second gate electrode and the third electrode are electrodes of the storage capacitor.

5. The display device of claim 2, wherein the data line has a two layer structure, wherein a first layer of the data line has the same material as the first electrode and a second layer of the data line has the same material as the second gate electrode.

6. The display device of claim 5, wherein the power line has a two layer structure, wherein a first layer of the power line has the same material as the third electrode and a second layer of the power line has the same material as the fourth electrode.

7. The display device of claim 6, wherein the second insulating layer is located between the data line and the power line.

8. The display device of claim 5, wherein the scan line includes the same material as the first gate electrode.

9. The display device of claim 8, wherein the first insulating layer is located between the data line and the scan line.

10. A display device, comprising:
a compensation transistor including a first gate electrode, a first insulating layer, a first electrode, a first channel, and a second electrode, which are sequentially stacked in a vertical direction;
a driving transistor including a second gate electrode, a second insulating layer, a third electrode, a second channel, and a fourth electrode, which are sequentially stacked in the vertical direction; and
a switching transistor having a first electrode connected to a data line, a second electrode connected to the fourth electrode of the driving transistor, and a gate electrode connected to a scan line,
wherein the first electrode of the compensation transistor is connected to the fourth electrode of the driving transistor, and the second electrode of the compensation transistor and the second gate electrode are the same electrode.

11. The display device of claim 10, wherein the first gate electrode of the compensation transistor is connected to the scan line.

12. The display device of claim 11, further comprising:
a storage capacitor connecting a power line and the second gate electrode of the driving transistor;
a first emission control transistor connecting the power line and the third electrode of the driving transistor;
a second emission control transistor connecting the fourth electrode of the driving transistor and an anode of an organic light emitting diode;
a first initialization transistor connecting the second gate electrode of the driving transistor and an initialization power line; and
a second initialization transistor connecting the anode of the organic light emitting diode and the initialization power line.

13. The display device of claim 10, wherein the first electrode of the compensation transistor is a source electrode and the second electrode of the compensation transistor is a drain electrode.

14. The display device of claim 10, wherein the third electrode of the driving transistor is a source electrode and the fourth electrode of the driving transistor is a drain electrode.

* * * * *